United States Patent [19]

Kaltenecker et al.

[11] Patent Number: 4,785,263
[45] Date of Patent: Nov. 15, 1988

[54] FET OSCILLATOR CIRCUIT

[75] Inventors: Robert S. Kaltenecker, Mesa, Ariz.; Robert E. Stengel, Ft. Lauderdale, Fla.; Ralph T. Enderby, Ft. Lauderdale, Fla.; James S. Irwin, Ft. Lauderdale, Fla.

[73] Assignee: Motorola, Inc., Schaumburg, Ill.

[21] Appl. No.: 55,207

[22] Filed: May 28, 1987

[51] Int. Cl.$^4$ .............................. H03B 5/00
[52] U.S. Cl. .............................. 331/117 FE
[58] Field of Search ............ 331/109, 116 R, 116 FE, 331/117 R, 117 FE

[56] References Cited

U.S. PATENT DOCUMENTS

| | | | |
|---|---|---|---|
| 3,421,111 | 1/1969 | Boyajian | 331/117 FE |
| 3,723,905 | 3/1973 | Sterner et al. | 331/109 |
| 4,193,046 | 3/1980 | Chiba | 331/109 |
| 4,438,351 | 3/1984 | Schuermeyer | 307/304 X |
| 4,553,110 | 11/1985 | Kleinberg | 331/117 FE X |
| 4,580,109 | 4/1986 | Lockwood | 331/117 FE |
| 4,609,884 | 9/1986 | Kindinger et al. | 331/109 |

OTHER PUBLICATIONS

"The Radio Amateur's Handbook", 1982, fifty-ninth edition.
UHF Syntor Synthesizer, schematic diagram.

Primary Examiner—Eugene R. Laroche
Assistant Examiner—Robert J. Pascal
Attorney, Agent, or Firm—Daniel K. Nichols

[57] ABSTRACT

A Ga As FET oscillator includes an FET having gate-drain and source connections. A tuned circuit is connected to the FET gate. Bias voltage is supplied to the FET. A parallel-connected resistor and capacitor is connected to the FET source. A Schottky diode is connected across the FET gate-source junction and the parallel connected resistor and capacitor, with its anode connected to the FET gate and its cathode connected to the resistor and capacitor. The Schottky diode limits the positive voltage across the gate-source junction of the Ga As FET to prevent gate-source current flow.

7 Claims, 1 Drawing Sheet

FET OSCILLATOR CIRCUIT

BACKGROUND OF THE INVENTION

This invention relates to oscillator circuits in general and particularly to Ga As FET (Gallium Arscenide Field Effect Transistor) oscillators. The use of a Ga As FET in an oscillators circuit can present problems relating to noise generation and loading of the tank circuit. These problems occur due to the relatively low forward bias voltage across the gate-source junction of the transistor required for the gate-source current flow. For a Ga As FET this voltage is approximately 0.2 volts as the gate-source junction of Ga As FET device is essentially a Schottky diode. When the signal applied across the gate-source junction exceeds the 0.2. volts, gate-source current flows, which both loads the oscillator tank circuit, as well as introduces noise in the oscillator output.

In JFET (junction field effect transistor) oscillator circuits, it is well known to provide a silicon diode from gate to ground ot limit the gate-source voltage. This approach limits the gate to ground voltage to approximately 0.6 volts, the forward bias voltage drop of the diode. It is also known to use a Schottky diode directly across a JFET gate-source connection, and from gate to ground (that is AC and DC ground). These approaches are not practical for use in Ga As FET oscillator circuits as gate-source current can flow under any of the arrangements.

SUMMARY OF THE INVENTION

This FET oscillator circuit includes means for limiting the voltage applied across the gate-source junction of the transistor for preventing forward biasing of the junction.

The FET oscillator circuit utilizes an FET having gate, drain and source connections. A resonance means is connected to the FET gate. A bias voltage means is connected to the FET. An impedance means is connected to the FET source. A Schottky diode is connected across the FET gate-source junction and the impedance means. The anode of the Schottky diode is connected to the gate, while the cathode is connected to the impedance means.

In one aspect of the invention, the impedance means includes a resistor. In another aspect of the invention, the impedance means includes a resistor and capacitor connected in parallel.

In still another aspect of the invention, the FET is a Ga As FET. In yet another aspect of the invention, the FET includes two gate connections. In still another aspect, both gate connections are connected to the Schottky diode anode.

In another aspect of the invention, the oscillator comprises a Colpitts oscillator.

DESCRIPTION OF THE PREFERRED EMBODIMENT

Figure 1:
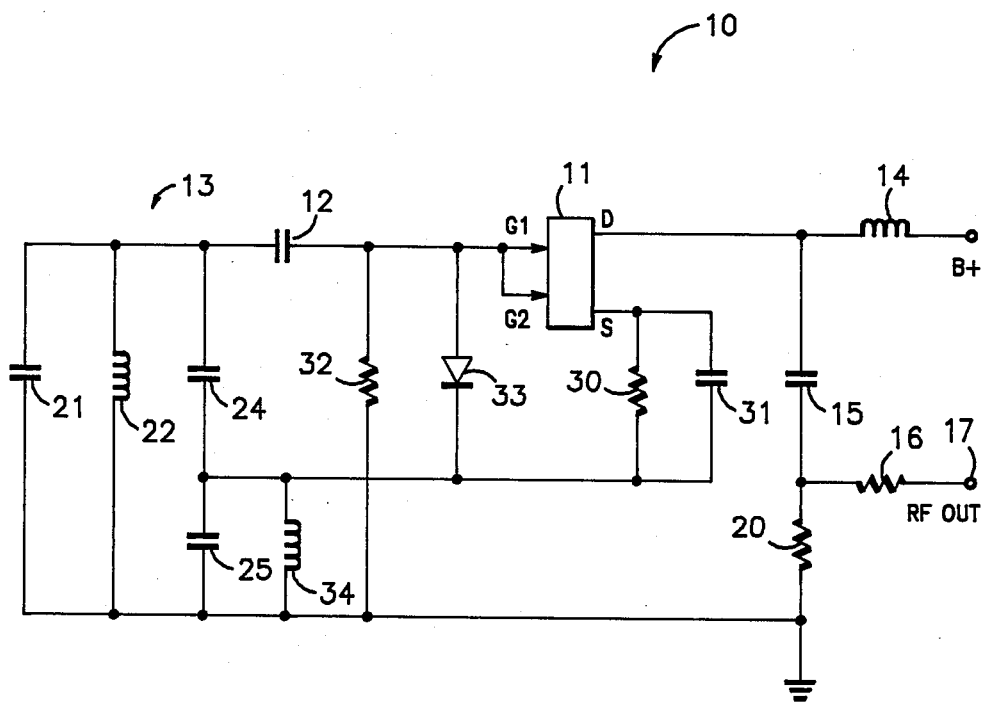
FIG. 1 is an electrical schematic view of an oscillator in accordance with the present invention.

Referring now by characters of reference to the drawing, it will be understood that the oscillator circuit, generally indicated by 10, includes a dual gate Ga As FET (transistor) 11 which has both gates connected by coupling capacitor 12 to a tank circuit 13. The drain of Ga As FET 11 is connected to a B+ voltage supply, constituting bias voltage means, as by RF choke 14, while the output signal is coupled by capacitor 15 and a resistor 16 to the output 17. A low impedance resistor 20, coupled between ground and the junction of capacitor 15 and resistor 16, provides an AC ground return path.

Tank circuit 13 includes parallel connected capacitor 21 and inductor 22 comprising resonance means. The resonant frequency of the oscillator 10 is determined by capacitor 21 and inductor 22 and the distributed reactance of the oscillator circuit 10. Series capacitors 24 and 25, which provide a voltage divider, are connected between the output of tank circuit 13 and ground for providing impedance matching and are chosen to optimize the oscillator noise figure rather than power output. The junction of capacitors 24 and 25 is connected to the source of Ga As FET 11 by the parallel connection of a resistor 30 and a capacitor 31. Resistor 30 and capacitor 31 constituting impedance means connected to the source of transistor 11. Resistor 30 provides the necessary DC bias voltage for starting the oscillator while capacitor 31 serves as the AC bypass capacitor.

A Schottky diode 33 has its anode connected to the gates of transistor 11 and its cathode to the junction of capacitors 24 and 25. The Schottky diode 33 is utilized to clip the positive going voltages across the gate-source junction of transistor 11 and the parallel combination of resistor 30 and capacitor 31 to hold the positive voltage going voltage to 0.2 volts, thereby preventing forward biasing of the gate-source junction of transistor 11. It will be appreciated that the junction of capacitors 24, 25 and 31, resistor 30, choke 34 and diode 33 is not at ground potential.

A resistor 32 is connected between the gates of transistor 11 and ground and has a relatively high resistance to provide a DC gate ground connection. A choke 34 is connected between the junction of capacitors 24 and 25 and ground in order to provide a DC supply path to the source of transistor 11. It will be appreciated that the junction of capacitors 24, 25 and 31, resistor 30, choke 34 and diode 33 is not at ground potential, as it is above AC ground.

It is believed the features and functional advantages of the Ga As FET oscillator are apparent from the foregoing description of parts, but for completeness of disclosure a brief description of the operation of the circuit will be given. In operation the signal applied to the gate of transistor 11 is effectively limited by the diode 33 on positive going peaks. Since the Schottky diode 33 will turn on at 0.2 volts, the positive voltage from the gate across the gate-source junction and across the parallel combination of resistor 30 and capacitor 31 is not permitted to exceed 0.2 volts. This 0.2 volts is divided between the gate-source junction and the voltage appearing across resistor 30 and capacitor 31. The average DC current flow through resistor 30 develops a small voltage drop across the resistor. The voltage across the gate-source junction is therefore limited to a value less than 0.2 volts and current flow across the gate. Source junction is prevented. By preventing such current flow, loading of the tank circuit is minimized and shot noise due to gate-source current is avoided.

The use of Schottky diodes with J-FET oscillators is shown in a co-pending patent application entitled "Dual FET Oscillator", by the same applicants, filed on the same day as this application under Express Mail Certificate of Mailing No. B68207717, the disclosure of which is hereby incorporated by reference as if fully set out herein.

The oscillator 10 can be constructed as a VCO (voltage controlled oscillator) by adding a varactor in series with capacitor 21. Oscillator 10 is a Colpitts oscillator as tapped capacitance is utilized. If desired, other oscillator types could be utilized.

While the preferred embodiment is illustrated as utilizing a dual gate Ga As FET 11, it will be understood that a single gate Ga As FET could also be utilized. Also the two gates need not be tied together. Schottky diodes can be utilized with either or both gates to limit the positive input voltages and prevent gate-source conduction.

We claim as our invention:

1. A FET oscillator circuit utilizing a FET having gate, drain and source connections comprising:
   resonance means connected to the FET gate;
   bias voltage means connected to the FET;
   impedance means connected to the FET source; and
   a Schottky diode connected across the FET gate-source junction and impedance means, with an anode connected to the FET gate and a cathode connected to the impedance means, whereby positive voltages across the gate-source junction are limited to prevent gate-source current flow;
   the impedance means comprising a resistor.

2. A FET oscillator circuit utilizing a FET having gate, drain and source connections comprising:
   resonance means connected to the FET gate;
   bias voltage means connected to the FET;
   impedance means connected to the FET source; and
   a Schottky diode connected across the FET gate-source junction and impedance means, with an anode connected to the FET gate and a cathode connected to the impedance means, whereby positive voltages across the gate-source junction are limited to prevent gate-source current flow;
   the impedance means comprising a resistor and capacitor connected in parallel.

3. A FET oscillator circuit utilizing a FET having gate, drain and source connections comprising;
   resonance means connected to the FET gate;
   bias voltage means connected to the FET;
   impedance means connected to the FET source; and
   a Schottky diode connected across the FET gate-source junction and impedance means, with an anode connected to the FET gate and a cathode connected to the impedance means, whereby positive voltages across the gate-source junction are limited to prevent gate-source current flow;
   the FET comprising a GaAs FET having two gate connections.

4. A FET oscillator circuit as defined in claim 3, in which:
   both gate connections are connected to the Schottky diode anode.

5. A FET oscillator circuit as defined in claim 3, in which:
   the oscillator comprises a Colpitts oscillator.

6. A Ga As FET oscillator circuit utilizing a Ga As FET having gate, drain and source connections comprising:
   a resonant circuit connected to the Ga As FET gate;
   a bias voltage connected to the Ga As FET;
   a parallel connected resistor and capacitor connected to the Ga As FET source; and
   a Schottky diode connected across the Ga As FET gate-source junction and the parallel connected resistor and capacitor, with an anode connected to the Ga As FET gate and a cathode connected to the resistor and capacitor, whereby voltages across the gate-source junction are limited to prevent gate-source current flow.

7. A Ga As FET oscillator circuit as defined in claim 6, in which:
   the oscillator comprises a Colpitts oscillator.

* * * * *